(12) United States Patent
Itoh

(10) Patent No.: US 6,838,770 B2
(45) Date of Patent: Jan. 4, 2005

(54) SEMICONDUCTOR DEVICE, DESIGNING METHOD AND DESIGNING DEVICE THEREOF

(75) Inventor: Niichi Itoh, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 8 days.

(21) Appl. No.: 09/891,356

(22) Filed: Jun. 27, 2001

(65) Prior Publication Data

US 2002/0024148 A1 Feb. 28, 2002

(30) Foreign Application Priority Data

Aug. 23, 2000 (JP) ........................................ 2000-251861

(51) Int. Cl.[7] .............................................. H01L 23/48
(52) U.S. Cl. ...................... 257/758; 257/630; 257/659; 257/211; 257/665; 257/207
(58) Field of Search ................................ 257/758, 630, 257/659, 211, 665, 207

(56) References Cited

U.S. PATENT DOCUMENTS 5,594,279 A * 1/1997 Itou et al. .................... 257/758

6,128,208 A 10/2000 Itoh et al.

FOREIGN PATENT DOCUMENTS

| JP | 2-43755 | 2/1990 |
|---|---|---|
| JP | 4-93069 | 3/1992 |
| JP | 9-289251 | 11/1997 |
| JP | 11297841 A | 10/1999 |
| KR | 1998-54477 | 9/1998 |

OTHER PUBLICATIONS

Related U.S. patent application Ser. No. 09/818,907, filed Mar. 28, 2001; Our Ref. No. 57454–059.

* cited by examiner

Primary Examiner—David E. Graybill
Assistant Examiner—Luan Thai
(74) Attorney, Agent, or Firm—McDermott Will & Emery LLP

(57) ABSTRACT

A semiconductor device is provided with dummy patterns at an originally thinner portion of each of layers, and each of these dummy patterns is electrically connected to a reference wire that is either a power-supply wire or a ground wire.

3 Claims, 15 Drawing Sheets

SEMICONDUCTOR DEVICE, DESIGNING METHOD AND DESIGNING DEVICE THEREOF

BACKGROUND OF THE INVENTION

1. Field of the Invention

The present invention relates to a semiconductor device and a designing method thereof, and also concerns a designing device for carrying out such a designing method.

2. Description of the Background Art

In general, in a manufacturing process of a semiconductor device, a photolithographic printing technique is sometimes used. More specifically, as illustrated in FIG. 17, a mask 5 having a predetermined pattern is formed on a removable layer 6, and light is directed to this so that a portion of the removable layer 6 that is not covered with the mask 5 is denatured and removed therefrom.

In this case, however, when there is a difference in the density depending on the portions of the pattern of the mask 5 as illustrated in FIG. 17, at a thin portion, light tends to farther proceed to reach the rear side of the mask 5 due to the occurrence of light diffraction, interference, etc., resulting in degradation in the precision of the resultant pattern (hereinafter, referred to as "patterning precision"). Consequently, the width of wiring to be formed sometimes becomes narrower than preliminarily planned. In a conventional manufacturing method for a semiconductor device which has widths of wiring such as 0.35 $\mu$m and 0.25 $\mu$m, the influence has not been so serious. In recent years, however, as the wiring becomes finer, and wiring having a width of not more than 0.18 $\mu$m has come to be produced. In the case of the production of such fine wiring, this problem has come to cause a reduction in the yield, and can not be neglected.

In order to solve the above-mentioned problems, the objective of the present invention is to eliminate the difference in density of a mask in the photolithographic technique, and another objective is to prevent a new structure, installed so as to eliminate the difference in density, from causing cross-talk noise.

SUMMARY OF THE INVENTION

In order to achieve the above-mentioned objective, in one aspect of the present invention, a semiconductor device, which is manufactured through a photolithographic technique, is provided with a dummy pattern that is installed so as to alleviate the difference in density so that degradation in the patterning precision occurring at a thinner portion at the time of exposure due to the difference in density is eliminated. The application of this arrangement alleviates the difference in density by installing the dummy pattern so that it becomes possible to prevent the phenomenon that causes degradation in the patterning precision in the photolithographic technique.

Moreover, in another aspect of the present invention, the semiconductor device is provided with a dummy pattern for alleviating the difference in density in an arranged pattern, a power-supply wire and a ground wire, and the dummy pattern is electrically connected to a reference wire which is either the power-supply wire or the ground wire. The application of this arrangement allows the dummy pattern to shift from a so-called floating state to a fixed electric potential of either the power-supply wire or the ground wire. Thus, the dummy pattern serves as a shield, thereby making it possible to prevent cross-talk noise occurring between the signal wires.

In the above-mentioned invention, more preferably, the electrical connection between all the dummy patterns and the reference wire is made through paths formed by a process including a first step of: setting all the dummy patterns as unconnected dummy patterns, a second step of: retrieving any unconnected dummy patterns that overlap each other and are adjacent to each other in an up and down direction with not less than a predetermined distance; in the case when, as a result of the retrieval, any of such unconnected dummy patterns are detected, recognizing these as adjacent dummy patterns and providing an interlayer connection between the target wire and the adjacent dummy patterns, as well as changing the setting of the adjacent dummy patterns as non-unconnected dummy patterns with the dummy patterns being set as those having the same electric potential as the target wire; recursively repeating the second step with respect to all the reference wire and those wires having the same electrical potential as the reference wire; in place of the reference wire, with the other of the power-supply wire and the ground wire being newly used as the reference wire, recursively repeating the second step with respect to all the reference wire and those wires having the same electrical potential as the reference wire.

With this arrangement, in principle, all the dummy patterns are electrically connected to the reference wire so that virtually all the dummy patterns are fixed in their electric potentials; thus, it is possible to provide a semiconductor device that is less likely to generate cross-talk noise. Moreover, this arrangement can provide a semiconductor device that can determine how to provide the interlayer connection between the dummy patterns virtually automatically based upon a predetermined algorithm.

Moreover, in order to achieve the above-mentioned objective, a designing method of a semiconductor device in accordance with the present invention, which is a method for generating dummy patterns so as to eliminate the difference in density in a wiring pattern based upon wiring layout information that has been provided, and for electrically connecting the dummy patterns and the reference wire with one of a power-supply wire and a grand wire being used as a reference wire based upon layout information of the power-supply wire and ground wire that have been supplied, is provided with a process including a first step of: setting all the dummy patterns as unconnected dummy patterns, a second step of: retrieving any unconnected dummy patterns that overlap each other and are adjacent to each other in an up and down direction with not less than a predetermined distance; in the case when, as a result of the retrieval, any of such unconnected dummy patterns are detected, recognizing these as adjacent dummy patterns and providing an interlayer connection between the target wire and the adjacent dummy patterns, as well as changing the setting of the adjacent dummy patterns as non-unconnected dummy patterns with the dummy patterns being set as those having the same electric potential as the target wire; recursively repeating the second step with respect to all the reference wire and those wires having the same electrical potential as the reference wire; in place of the reference wire, with the other of the power-supply wire and the ground wire being newly used as the reference wire, recursively repeating the second step with respect to all the reference wire and those wires having the same electrical potential as the reference wire; thus, connection path information on each of the dummy patterns and either of the power-supply wire and the ground wire is directed.

In the above-mentioned method, in principle, with respect to all the dummy patterns, electrical connection is made from either the power-supply wiring or the ground wiring. Each of the dummy patterns is fixed in its electrical potential by being connected to either the power-supply wire or the ground wire; thus, the dummy pattern located between the signal wires is allowed to serve as a shield so that it is possible to prevent adverse effects due to cross-talk noise.

In the above-mentioned invention, the designing method of a semiconductor device is preferably carried out after a layout designing job, and then, a design rule check, a coincident inspection between the circuit diagram and the layout, and calculations on the capacitance and resistance of the wiring are carried out. The application of the above-mentioned method makes it possible to prevent inconsistency occurring between the results of calculations and actual tests in a semiconductor device, and consequently to carry out a prediction with high precision.

Moreover, in order to achieve the above-mentioned objective, the memory medium of the present invention has a program recorded thereon, which allows a computer to execute the designing method of a semiconductor device. The application of this arrangement allows the above-mentioned designing method to be executed automatically by a computer; therefore, it becomes possible to reduce a burden imposed on the operator, and to carry out a quick operation with precision.

In order to achieve the above-mentioned objective, the designing device of a semiconductor device of the present invention is provided with: a dummy pattern generation means for generating dummy patterns so as to eliminate the difference in density in a wiring pattern based upon wiring layout information that has been provided; an unconnected dummy pattern setting means for setting all the dummy patterns as unconnected dummy patterns so as to electrically connect the dummy patterns and the reference wire with one of a power-supply wire and a grand wire being used as a reference wire based upon layout information of the power-supply wire and ground wire that have been supplied; a first reciprocating job executing means which retrieves any unconnected dummy patterns that overlap each other and are adjacent to each other in an up and down direction with not less than a predetermined distance, which in the case when, as a result of the retrieval, any of such unconnected dummy patterns are detected, recognizes these as adjacent dummy patterns and provides an interlayer connection between the target wire and the adjacent dummy patterns, as well as changing the setting of the adjacent dummy patterns as non-unconnected dummy patterns with the dummy patterns being set as those having the same electric potential as the target wire, which recursively repeats the sequence of jobs with respect to all the reference wire and those wires having the same electrical potential as the reference wire; and a second reciprocating job executing means which, in place of the reference wire, with the other of the power-supply wire and the ground wire being newly used as the reference wire, recursively repeats the sequence of jobs with respect to all the reference wire and those wires having the same electrical potential as the reference wire.

The application of the above-mentioned arrangement enables a designing process in which the layout of dummy patterns and the electrical connection from the respective dummy patterns either to the power-supply wire or to the ground wire are effectively placed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 13:
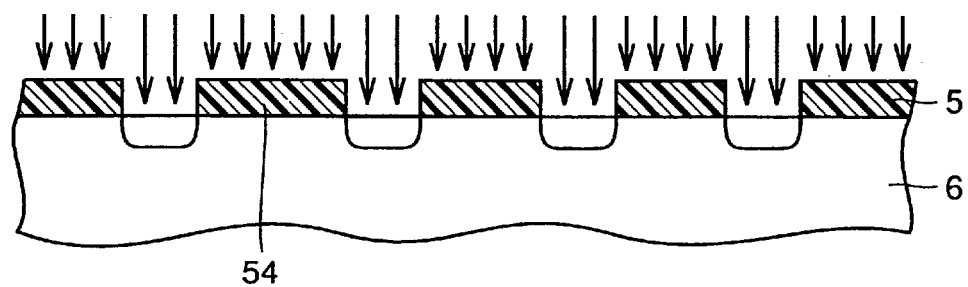
FIG. 13 is an explanatory drawing that shows the manufacturing process of a semiconductor device in a first embodiment in accordance with the present invention.

As illustrated in FIG. 13, in order to prevent degradation in the patterning precision occurring at a thin portion at the time of exposure in the photolithographic printing technique, a dummy pattern 54 is inserted to a thin portion in a mask 5 of each of wiring layers so as to alleviate a difference in density.

In the pattern of the mask 5, the dummy pattern 54 is inserted to each thin portion so that the pattern is seemingly free from the difference in density; thus, the degree of the occurrence of light diffraction is reduced to be the same as that of a dense portion, and it is possible to prevent degradation in the patterning precision.

(Second Embodiment)

In a conventional method, with respect to a flow of processes in a CAD (Computer Aided Design) system for designing a semiconductor device, a design rule check (DRC) is conducted after a layout designing job. The DRC is a process for checking to see whether or not a wiring layout conforms to a predetermined manufacturing standard. Next, the wiring layout, obtained through a design, is subjected to a layout vs schematic (LVS) process to check to see whether it matches with the circuit diagram of an originally expected circuit. Then, calculations are carried out with respect to the capacitance and resistance of the wiring.

A layout design of a dummy pattern to be added to wiring is carried out efficiently by using a mask generation CAD system, or the like.

Here, in order to generate a mask, a method is proposed in which a flow of jobs in a conventional designing CAD system is used as it is, and the designing data thus obtained is transferred to the mask generation CAD system so as to generate a mask. In this method, however, although a dummy pattern is not considered at the time of calculations on the capacitance and resistance of wiring, data finally made is obtained with the dummy pattern, with the result that although confirmed on the calculations, the capacitance tends to be inconsistent with the capacitance of the actual product.

Figure 14:
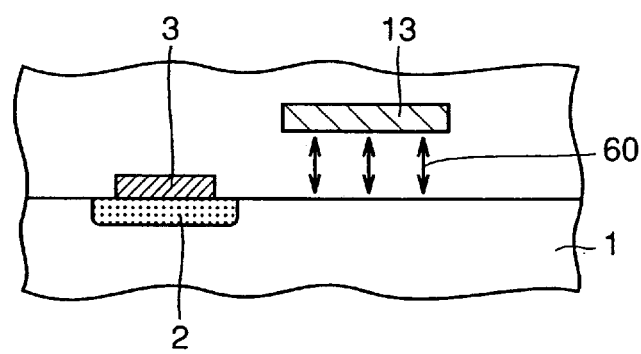
FIG. 14 is a first explanatory drawing that shows an inspection process in the designing contents in a semiconductor device in the second embodiment in accordance with the present invention.
Figure 15:
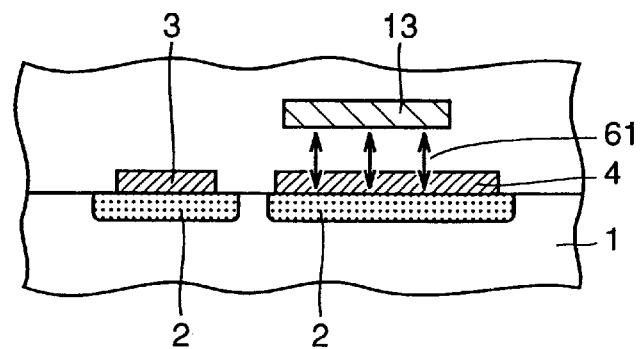
FIG. 15 is a second explanatory drawing that shows the inspection process in the designing contents in a semiconductor device in the second embodiment in accordance with the present invention.

For example, as illustrated in FIG. 14, it is assumed that there is a pattern of a polysilicon wiring layer 3 formed on a scattered area 2 on a semiconductor substrate 1, and that a metal wiring layer 13 exists as the first layer above this pattern. In this case, upon calculating the capacitance of the metal wiring layer 13, the capacitance is derived from a portion between the opposing metal wiring layer 13 and the semiconductor substrate 1, that is, a so-called counter substrate capacitance 60 is found as the calculated value. However, as illustrated in FIG. 15, when a dummy pattern is formed thereafter, a polysilicon dummy pattern 4 is placed in the same level as the polysilicon wiring layer 3 by taking into consideration the density of the polysilicon wiring layer 3, and a scattered area 2 corresponding to this is placed; therefore, the capacitance derived from the metal wiring layer 13 is not the counter substrate capacitance 60, but a counter scattered area capacitance 61, resulting in an inconsistency from the state at the time of calculations and the subsequent error in wiring delay. In particular, since the counter scattered area capacitance 61 is greater than the counter substrate capacitance 60, the wiring delay might cause a serious problem.

Therefore, in order to avoid such problems, a designing method in the first embodiment in accordance with the present invention is allowed to generate a dummy pattern prior to the stage before calculations of DRC, LVS and the capacitance and resistance of wiring just after a layout designing job.

Moreover, if the dummy pattern is placed without being connected to another wiring, that is, in a floating state, the signal wires interfere with each other through the dummy pattern, and might pick up cross-talk noise. Therefore, it is preferably for the dummy pattern to be connected to a wire whose electrical potential is determined.

Figure 12:
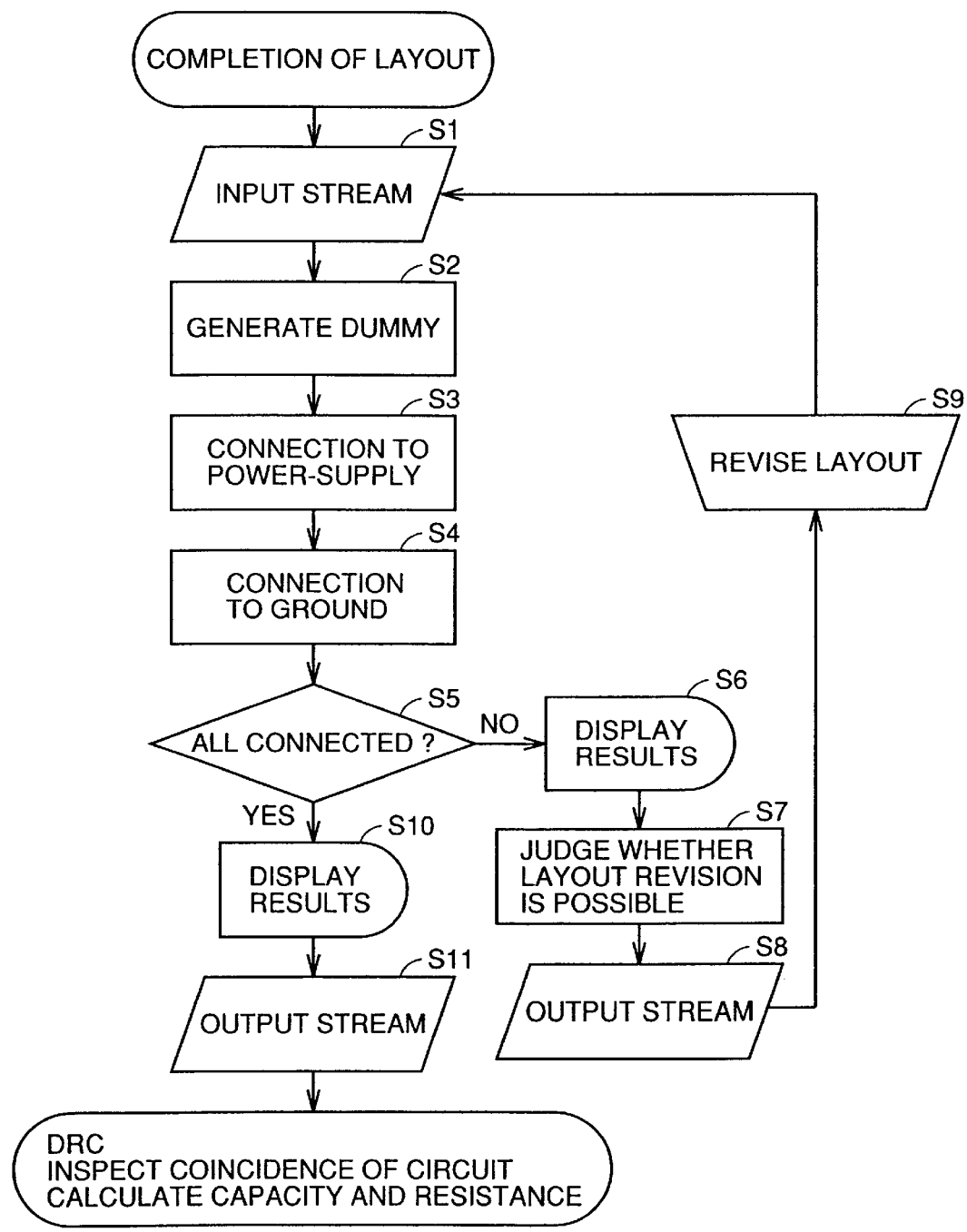
FIG. 12 is a flow chart that schematically shows a designing method in the second embodiment in accordance with the present invention.

FIG. 12 shows a schematic flow for generating a dummy pattern by using a designing method in accordance with the present embodiment. First, a designer carries out layout designing jobs. After the jobs, the layout is subjected to DRC and LVS processes in a state without a dummy pattern so as to confirm whether it contains no problem. Thereafter, data related to the transistor layout and connection of wiring of a layout generally referred to as "stream" is supplied to the designing method of the present embodiment in accordance with the present invention. Here, the designing method in the present embodiment is carried out on a computer based upon a dummy pattern generation program.

First, at step S1, the stream is inputted to the dummy pattern generation program.

Figure 1:
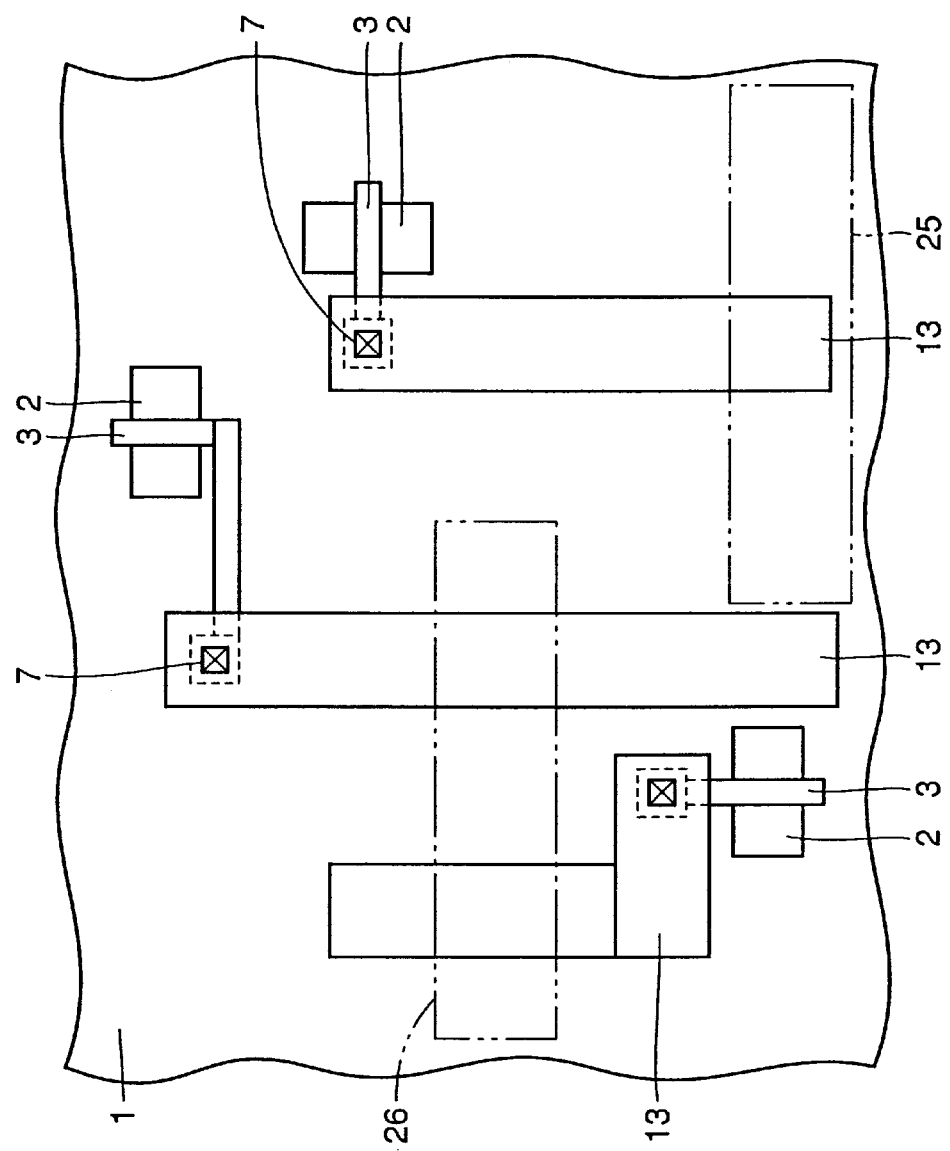
FIG. 1 is a plan view that shows a first step of a designing process of a semiconductor device in a second embodiment in accordance with the present invention.

In the present embodiment, an explanation will be given of a layout shown in FIG. 1. FIG. 1 is a plan view that shows a wiring structure consisting of a plurality of layers stacked in an up and down direction, and on the semiconductor substrate 1, scattered areas 2 are formed in some portions as source/drain areas. A polysilicon wiring layer 3 is placed on portions corresponding to the scattered areas 2 with their upper side portions contacting the layer 3. A metal wiring layer 13 is placed as a first layer that is a layer above the polysilicon layer 3. Moreover, a power-supply wire 25 and a ground wire 26, which are indicated by alternate long and two short dashes lines in the Figure, are placed as a second layer that is a layer above the above-mentioned layer. The metal wiring layer 13 is electrically connected to the polysilicon wiring layer 3 below through via holes 7.

The stream inputted to the dummy pattern generation program in step S1, is allowed to contain the information of such a layout.

At step S2, a dummy pattern is generated. This process automatically generates each dummy pattern in a thin portion of each mask layer while taking the DRC rule into consideration.

Figure 2:
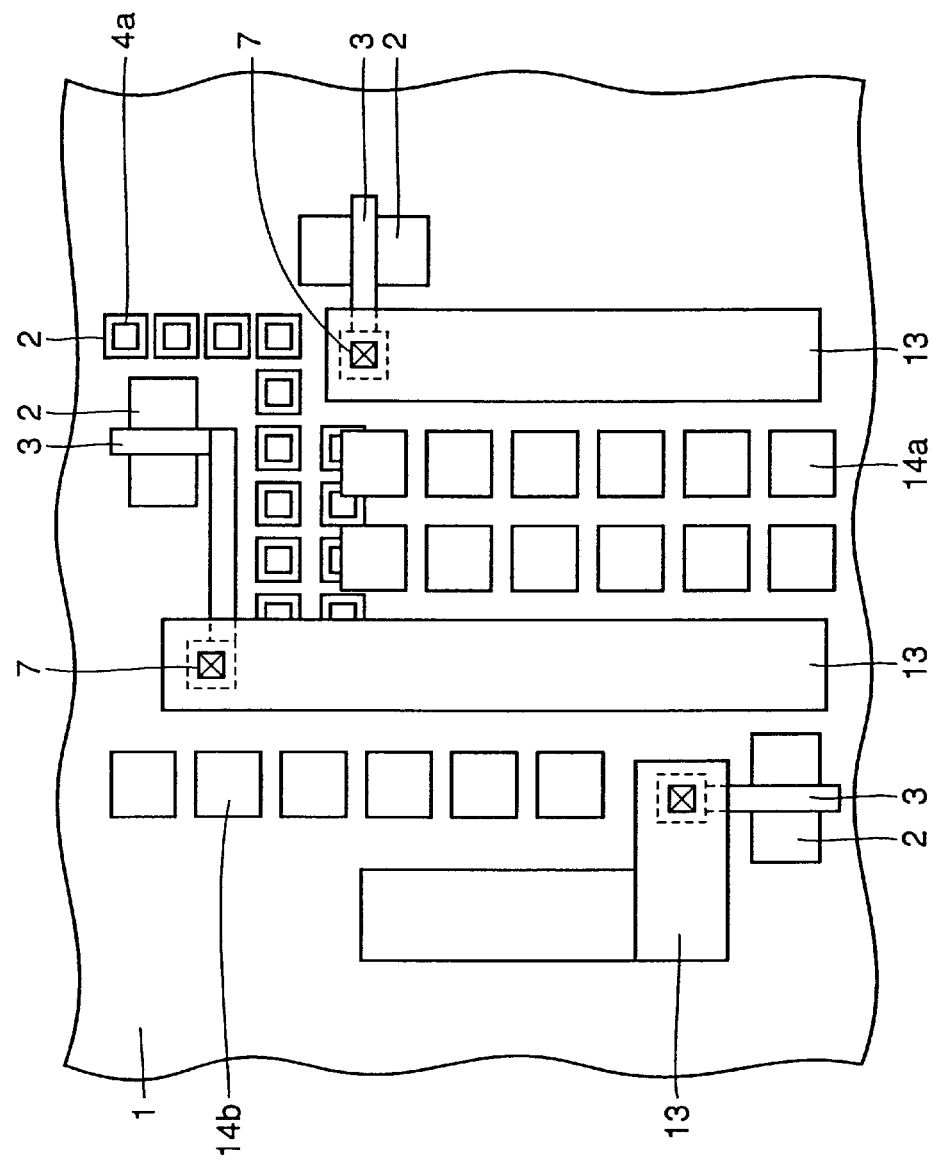
FIG. 2 is a plan view that shows a first example of a second step of the designing process of a semiconductor device in the second embodiment in accordance with the present invention.

In the case of the layout as shown in FIG. 1, for example, as illustrated in FIG. 2, a polysilicon dummy pattern 4a and metal dummy patterns 14a and 14b of the first layer may be generated as dummy patterns. In the example of FIG. 2, a predetermined number of the dummy patterns are generated and placed in a manner so as to fill thin portions of the respective mask layers, that is, void areas without regular wires, with for example, a small piece having a fixed shape such as a square shape as one unit.

Figure 3:
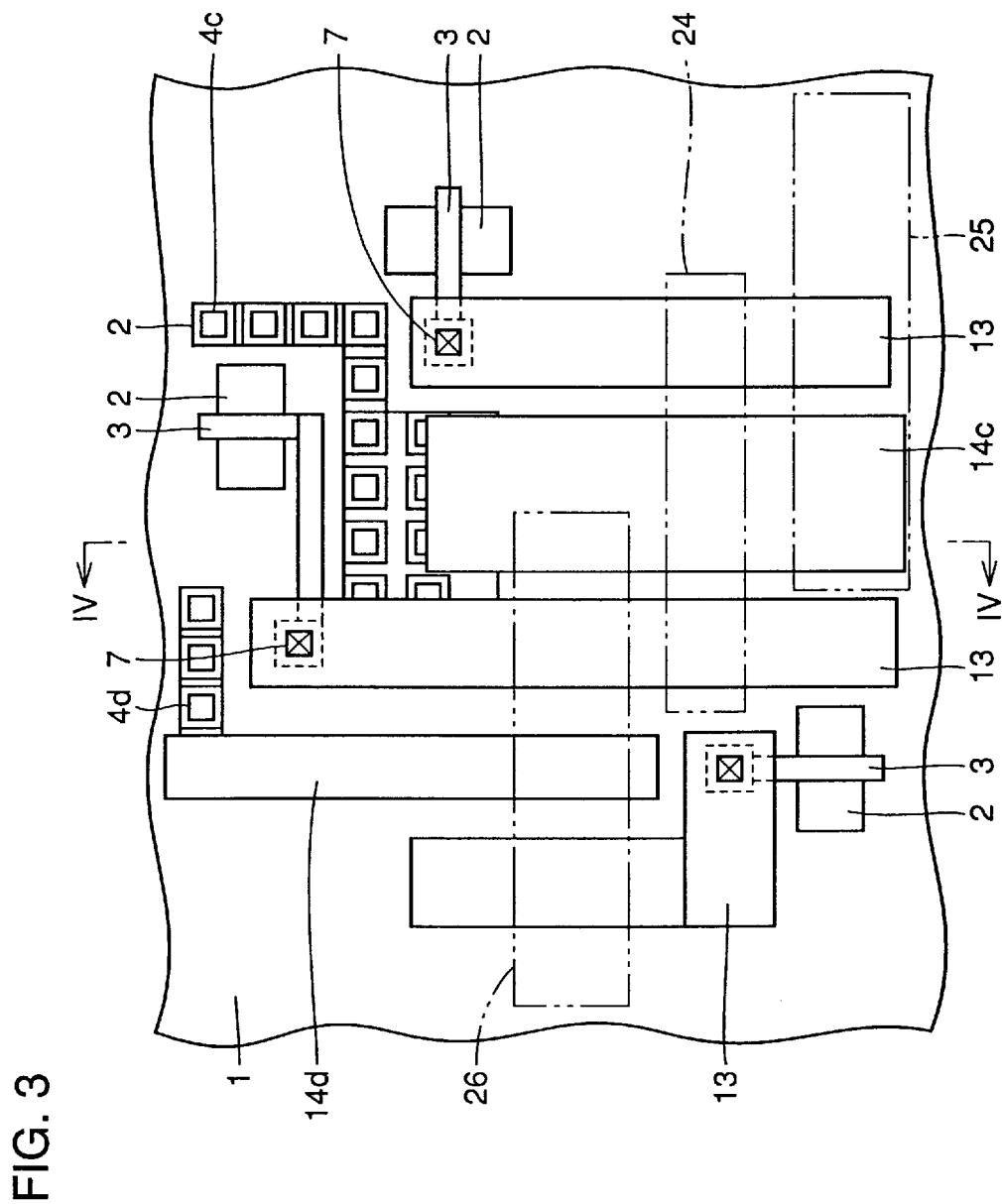
FIG. 3 is a plan view that shows a second example of the second step of the designing process of a semiconductor device in the second embodiment in accordance with the present invention.
Figure 4:
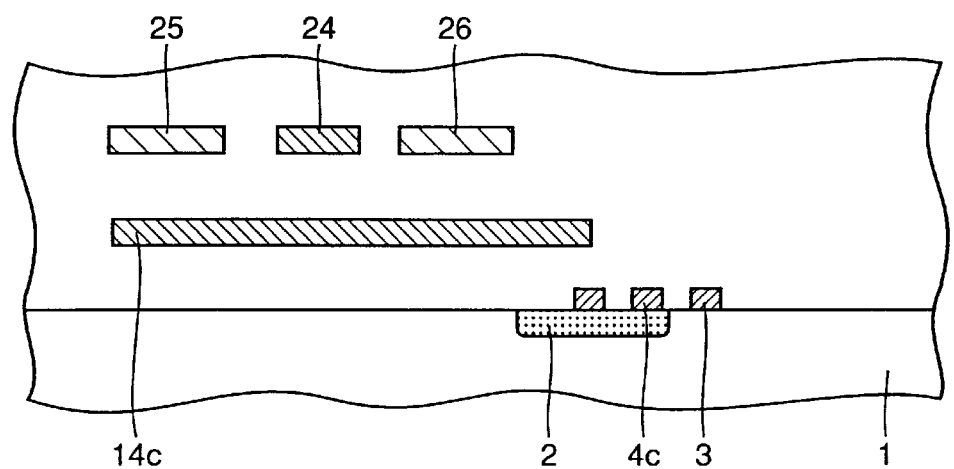
FIG. 4 is a cross-sectional view that shows the first example of the second step of the designing process of a semiconductor device in the second embodiment in accordance with the present invention.

Alternatively, as illustrated in FIG. 3, a polysilicon dummy pattern 4c, metal dummy patterns 14c and 14d of the first layer, and a metal dummy pattern 24 of the second layer, may be generated at the respective layers as dummy patterns. In the example of FIG. 3, dummy patterns having predetermined areas are generated in a manner so as to fill void areas without regular wires, and placed therein. FIG. 4 shows cross-sectional views taken along line IV—IV of FIG. 3.

Figure 5:
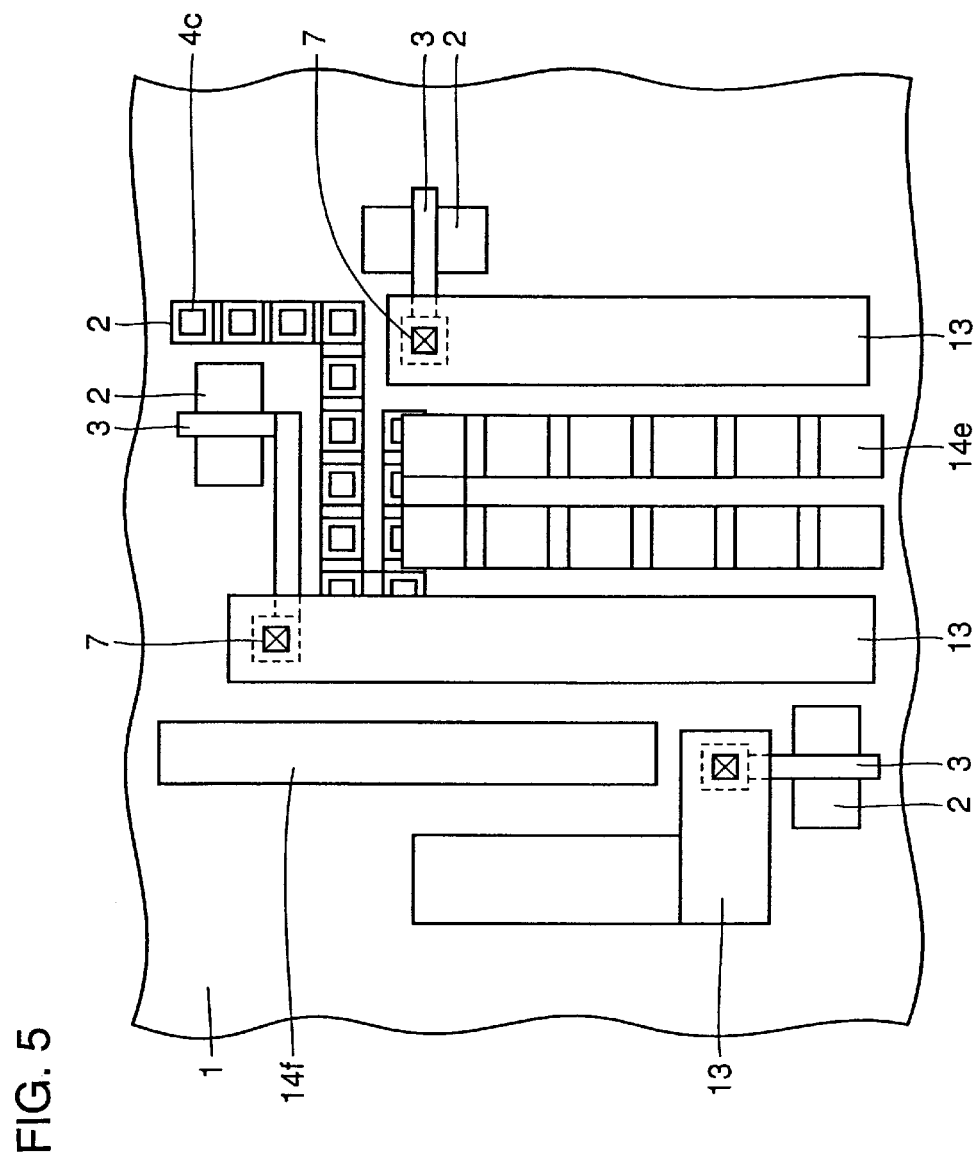
FIG. 5 is a plan view that shows a third example of the second step of the designing process of a semiconductor device in the second embodiment in accordance with the present invention.

Alternately, as illustrated in FIG. 5, a dummy pattern may be formed in a manner like one stroke of the brush. In this case, a linear dummy pattern forms a basis, and in a wider space having a width thicker than the dummy pattern line width, a zigzag line or a spiral line is drawn.

In the present embodiment, an explanation will be given of a dummy pattern shown in FIGS. 3 and 4.

First, at a first step, flags for identifying unconnected dummy patterns are put at generated dummy patterns. Therefore, in the examples of FIGS. 3 and 4, flags indicating unconnected dummy patterns are put on the polysilicon dummy pattern 4c, the metal dummy patterns of the first layer 14c and 14d and the metal dummy pattern 24 of the second layer. This first step is not described as an independent block in FIG. 12, but is carried out as one portion of the process of S2.

Next, either of the two kinds of wires, a power-supply wire and a ground wire, is alternately used as a reference wire, dummy patterns are connected. In examples of the present invention, first, after the dummy patterns have been connected with the power-supply wire being used as the reference wire, the dummy patterns are connected; however, in contrast, the ground wire may be first used as the reference wire, and the power-supply wire may be next used as the reference wire.

In the example of the present embodiment, up to this time, since the power-supply wire has been used as the reference wire, the dummy patterns are connected with the power-supply wire being used as a start point. In step S3, the second step, which will be described later, is repeated recursively.

With respect to the reference wire, the second process is provided with:

(1) using the reference wire and one of the wires having the same electrical potential as the reference wire at that point of time as target wires, (2) retrieving any unconnected dummy patterns that satisfy predetermined conditions with respect to the target wires, (3) as a result of the retrieval, upon detecting any unconnected dummy pattern, (3.1) setting this as adjacent dummy patterns, (3.2) providing an interlayer connection between the target wires and the adjacent dummy patterns;

(3.3) changing the setting of these adjacent dummy patterns as non-unconnected dummy patterns; and (3.4) changing the setting of these adjacent dummy patterns as being the same electrical potential as the target wires.

The second process is recursively repeated with respect to all the power-supply wire and wires having the same electrical potential as the power-supply wire.

More specifically, in the present embodiment, among a plurality of power-supply wires as originally formed, the one located as the uppermost layer is first selected as the target wire so as to carry out the second process. Here, this is not necessarily limited to the uppermost layer, the lowermost layer may be first selected as the target wire, or one in the middle may be selected as the target wire.

Referring to FIGS. 3 to 7, an explanation will be given of the process. In the example shown in FIGS. 3 and 4, the power-supply wire located as the uppermost layer is a power-supply wire 25. Therefore, using the power-supply wire 25 on the second layer as the starting point, a retrieving process is carried out to find any unconnected dummy patterns which are overlapped and adjacent to each other as one layer on the other in an up and down direction. In this example, supposing that the connectable distance of the via hole is one layer, the retrieving range is set within one layer in an up and down direction; however, if the connectable distance of the via hole is longer, the retrieving range may be set within two layers, three layers, or more layers.

Figure 6:
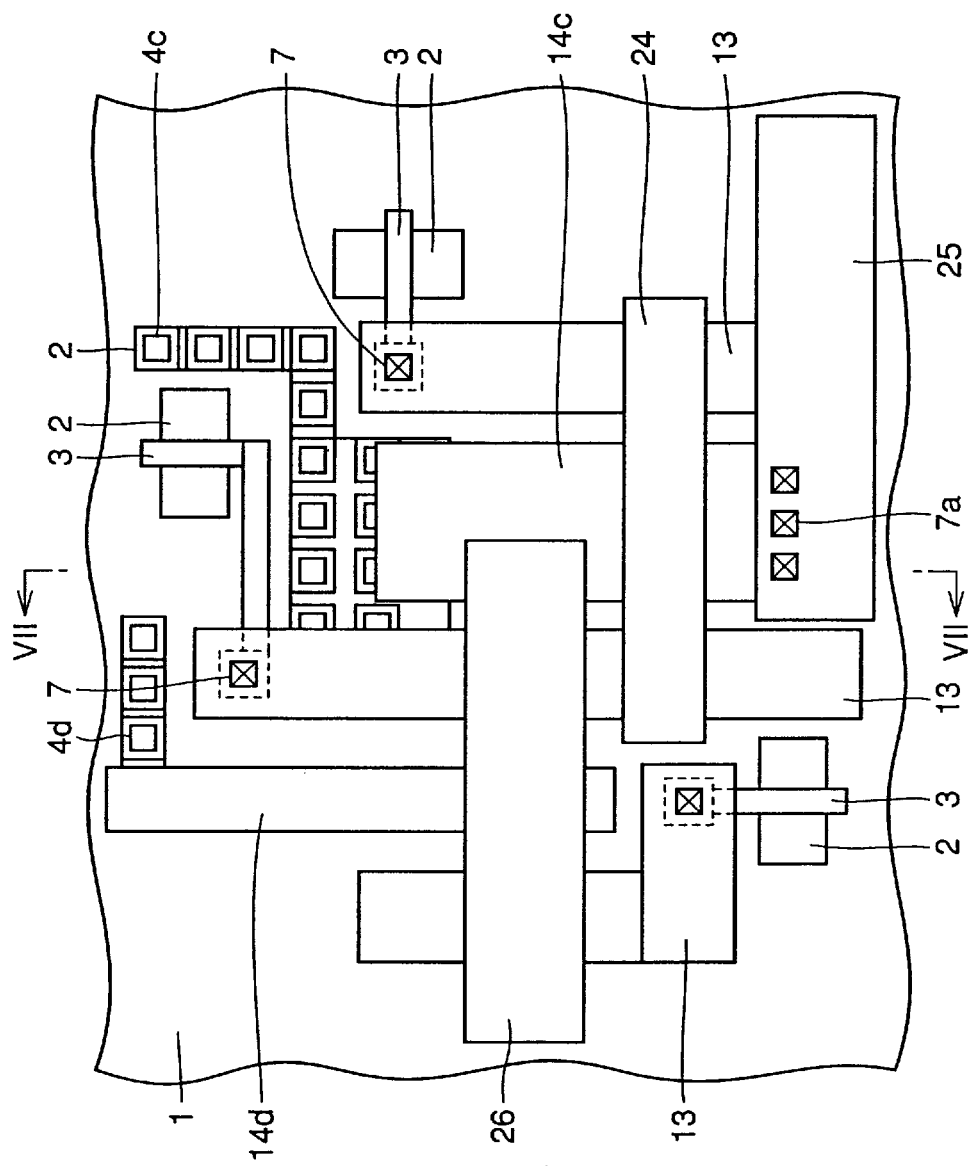
FIG. 6 is a plan view that shows a third step of the designing process of a semiconductor device in the second embodiment in accordance with the present invention.
Figure 7:
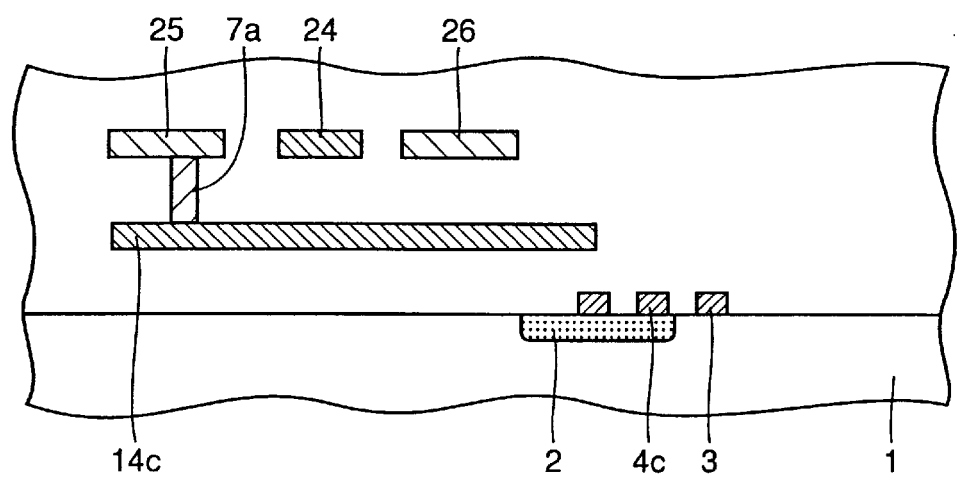
FIG. 7 is a cross-sectional view that shows the third step of the designing process of a semiconductor device in the second embodiment in accordance with the present invention.

The metal dummy pattern 14c of the first layer is detected by the above-mentioned retrieval. Thus, the metal dummy pattern 14c is set as an adjacent dummy pattern of the first layer. As illustrated in FIGS. 6 and 7, between the power-supply wire 25 of the second layer set as the target wire and the metal dummy pattern 14c of the first layer set as the adjacent dummy pattern, a via hole 7a is placed as an interlayer connection so as to connect them. Here, FIG. 7 is cross-sectional view taken along line VII—VII of FIG. 6.

In this manner, since the metal dummy pattern 14c of the first layer has been connected to the power-supply wire 25 of the second layer that is the target layer, a flag indicating unconnected dummy pattern, given to the metal dummy pattern 14c of the first layer, is removed, and instead, the metal dummy pattern 14c of the first layer is set to have the same electrical potential as the power-supply wire 25 of the second layer that is the target wire. Since the second process is recursively repeated with respect to all the power-supply wire and wires having the same electrical potential, the metal dummy pattern 14c of the first layer that comes to have the same electrical potential is also set as a new target for the second process.

At this time, with respect to the power-supply wire and wires having the same electrical potential as the power-supply wire, since the one that has not been subjected to the second process is only the metal dummy pattern 14c of the first layer, the second process is next carried out, using the metal dummy pattern 14c of the first layer as the target wire.

Figure 8:
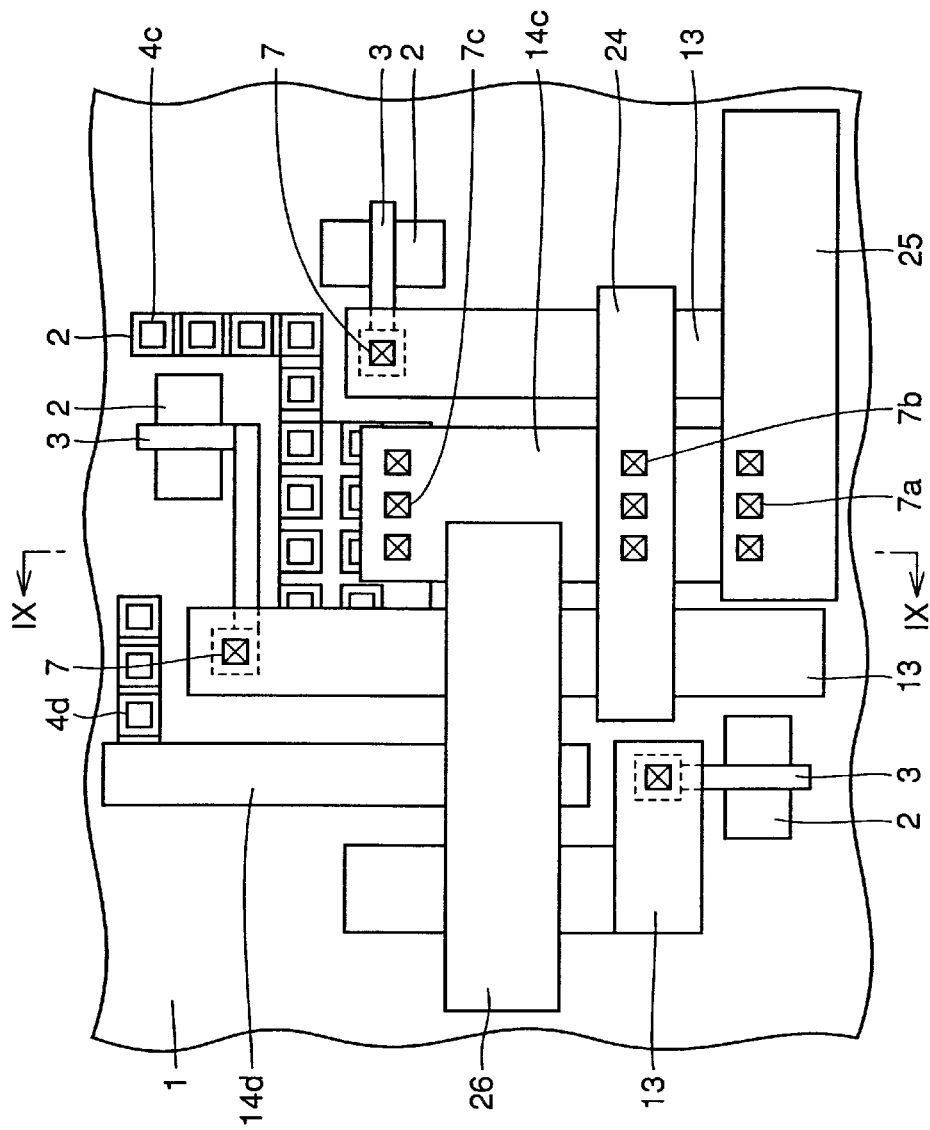
FIG. 8 is a plan view that shows a fourth step of the designing process of a semiconductor device in the second embodiment in accordance with the present invention.
Figure 9:
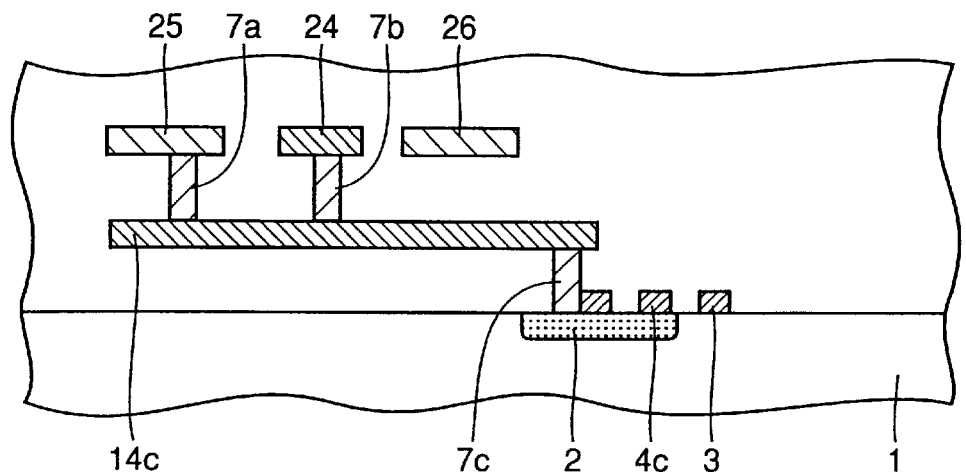
FIG. 9 is a cross-sectional view that shows a fourth step of the designing process of a semiconductor device in the second embodiment in accordance with the present invention.

Using the metal dummy pattern 14c of the first layer that is the target wire as the starting point, the retrieving process is carried out to find any unconnected dummy patterns which are overlapped and adjacent to each other as one layer on the other in an up and down direction. As a result of the retrieval, the metal dummy pattern 24 of the second layer and the polysilicon dummy pattern 4c are detected. Thus, these are set as adjacent dummy patterns. Between the metal dummy pattern 14c of the first layer as the target wire and the metal dummy pattern 24 of the second layer as the adjacent dummy pattern, a via hole 7b is placed as an interlayer connection so as to connect them. Moreover, between the metal dummy pattern 14c of the first layer as the target wire and the polysilicon dummy pattern 4c as the adjacent dummy pattern, a via hole 7c is placed as an interlayer connection so as to connect them. FIG. 8 shows a state in which the via holes 7b and 7c are placed in this manner. FIG. 9 is a cross-sectional view taken along line IX—IX of FIG. 8.

Further, flags indicating unconnected dummy pattern, given to the metal dummy pattern 24 of the second layer and the unconnected dummy pattern of the polysilicon dummy pattern 4c, are removed. The settings of the metal dummy pattern 24 and the polysilicon dummy pattern 4c are changed to be the same electrical potential as the metal dummy pattern 14c of the first layer serving as the target wire. Here, since the metal dummy pattern 14c of the first layer has been set to have the same electrical potential as the power-supply wire, the metal dummy pattern 24 of the second layer and the polysilicon dummy pattern 4c are also set to the same electrical potential as the power-supply wire.

At this time, with respect to the power-supply wire and wires having the same electrical potential as the power-supply wire, the ones that have not been subjected to the second process are the metal dummy pattern 24 of the second layer and polysilicon dummy pattern 4c that comes to have the same electrical potential as the power-supply wire. Therefore, the second process is next carried out, using these wire as the target wires. Among these, any unconnected dummy patterns are retrieved, and in this case, since no unconnected dummy pattern to be detected exists, the process of S3 is complete.

Next, the sequence proceeds to a process of S4. In the process as described above, the power-supply wire is set as the reference wire, and in this case, instead of this reference wire, the ground wire is set as the reference wire. Then, with respect to all the ground wires and wires having the same electrical potential as the ground wire, the above mentioned second process is repeated recursively.

Figure 10:
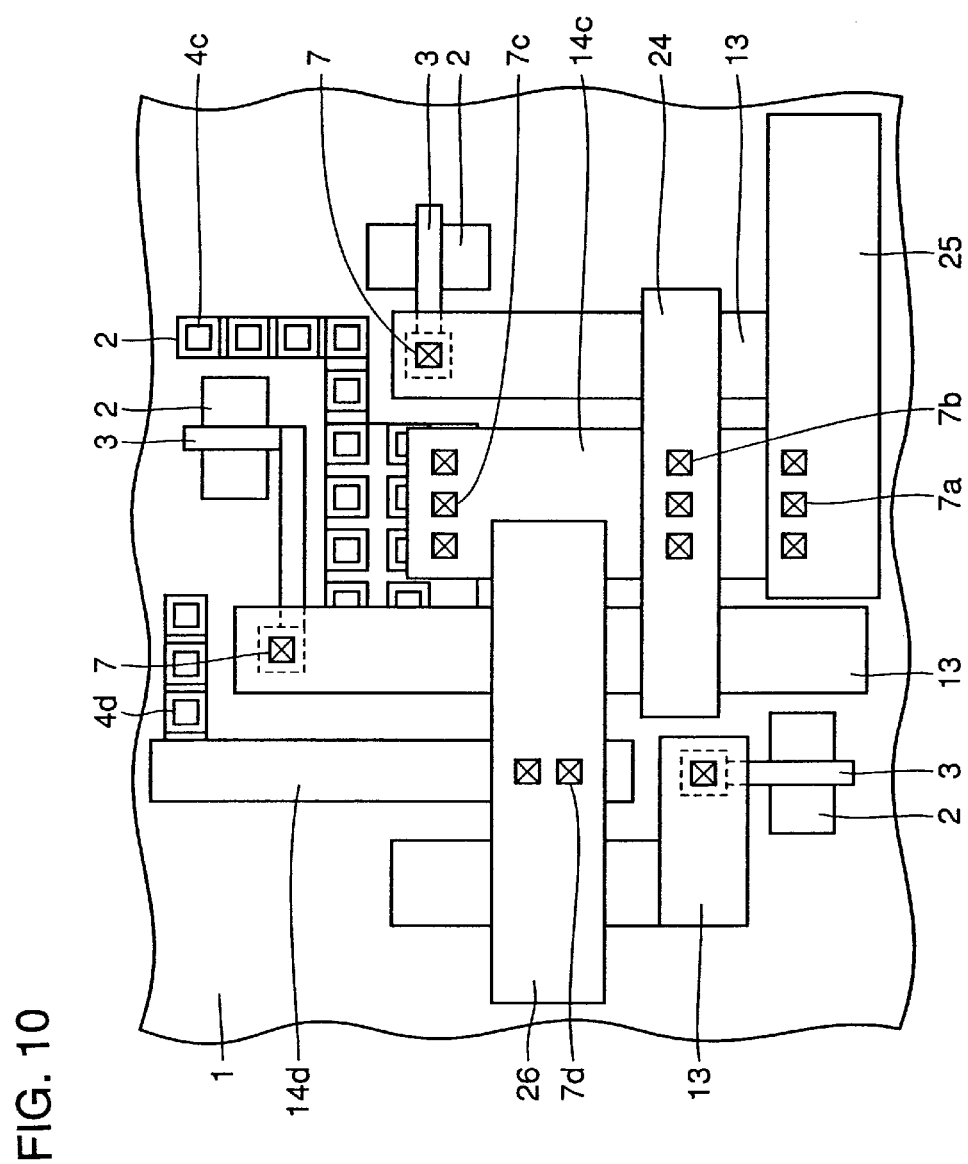
FIG. 10 is a plan view that shows a fifth step of the designing process of a semiconductor device in the second embodiment in accordance with the present invention.

Referring to FIGS. 8 and 9, an explanation will be given of the process. With respect to the ground wire and wires having the same electrical potential as the ground wire, the ground wire 26 of the second layer is listed. Therefore, with respect to the ground wire 26 of the second layer serving as the target wire, using this as the starting point, the retrieving process is carried out to find any unconnected dummy patterns which are overlapped and adjacent to each other as one layer on the other in an up and down direction. As a result of the retrieval, the metal dummy pattern 14d of the first layer is detected. Therefore, the ground wire 26 of the second layer is set as the adjacent dummy pattern. As illustrated in FIG. 10, between the metal dummy pattern 14d of the first layer as the target wire and the metal dummy pattern 14d of the first layer serving as the adjacent dummy pattern, a via hole 7d is placed as an interlayer connection so as to connect them.

Then, a flag indicating unconnected dummy pattern, given to the metal dummy pattern 14d of the first layer, is removed. The setting of the metal dummy pattern 14d of the first layer is changed to be the same electrical potential as the ground wire 26 of the second layer as the target wire. Therefore, the metal dummy pattern 14d of the first layer is set to have the same electrical potential as the ground wire.

At this time, with respect to the ground wire and wires having the same electrical potential as the ground wire, the one that has not been subjected to the second process is the metal dummy pattern 14d of the first layer that comes to have the same electrical potential as the ground wire.

Figure 11:
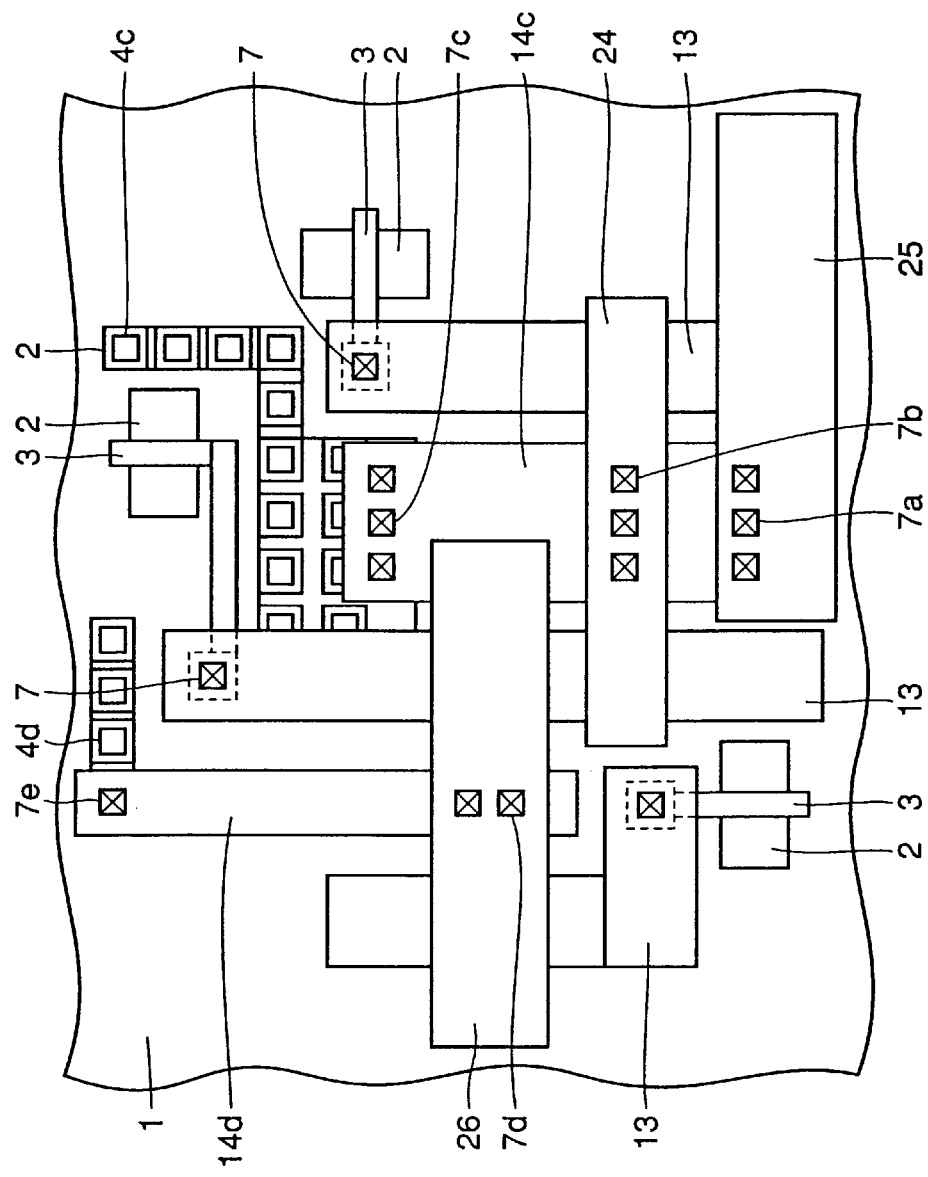
FIG. 11 is a plan view that shows a six step of the designing process of a semiconductor device in the second embodiment in accordance with the present invention.

Therefore, using the metal dummy pattern 14d of the first layer as the target wire, the second process is carried out. As a result of the retrieval for any unconnected dummy pattern among these, the polysilicon dummy pattern 4d is detected. Thus, these are set as adjacent dummy patterns. As illustrated in FIG. 11, between the metal dummy pattern 14d of the first layer serving as the target wire and the polysilicon dummy pattern 4d as the adjacent dummy pattern, a via hole 7e is placed as an interlayer connection to connect them.

Moreover, a flag indicating unconnected dummy pattern, given to the polysilicon dummy pattern 4d, is removed. Thus, the setting of the polysilicon dummy pattern 4d is changed so as to have the same electrical potential as the metal dummy pattern 14d of the first layer serving as the target wiring. Here, since the metal dummy pattern 14d of the first layer has been set to have the same electrical potential as the ground wire, the polysilicon dummy pattern 4d is also set to the same electrical potential as the ground wire.

At this time, with respect to the ground wire and wires having the same electrical potential as the ground wire, the one that has not been subjected to the second process is the polysilicon dummy pattern 4d that has been newly set to the same electrical potential as the ground wire. Therefore, the second process is next carried out, using this as the target wire. Among these, no unconnected dummy to be detected exists, the process of S4 is complete.

Next, the sequence proceeds to a process of S5. Here, a confirming process is carried out as to whether or not any residual flags indicating unconnected dummy pattern exist, thereby making a judgment as to whether or not all the dummy patterns are connected. If there is no dummy pattern having a flag, it is judged that "all are connected"; thus, the sequence proceeds to a process of S10, thereby displaying the state of the layout including the dummy pattern layout thus determined and the interlayer connections between the dummy patterns, as the results of the designing. The results of the designing are outputted as the stream in a step S11. Thereafter, calculations on the DRC, LVS, wiring capacitance and resistance are carried out.

If, at step S5, even one of the flags exists, the sequence returns to the step S6, thereby displaying the results of the designing. At step S7, a judgment is made as to whether or not the results of the designing can be revised. Moreover, the results of the current designing at step S8 is outputted as the stream. By using the stream, the operator again carries out a revising job of the layout on a designing CAD. After completion of the revising job, the sequence is resumed from step S2.

With this arrangement, in principle, with respect to all the dummy patterns, it is possible to carry out electrical connection processes from the power-supply wire or the ground wire efficiently. The respective dummy patterns are electrically connected to the power-supply wire or the ground wire so that their electrical potentials are fixed; thus, each of the dummy patterns located between signal wires serves as a shield, thereby making it possible to prevent adverse effects from cross-talk noise. Moreover, in the case when there is any dummy pattern that has not been electrically connected to the power-supply wire or the ground wire, this fact is clearly indicated so that the operator can readily revise the layout through a layout revising process.

Moreover, the dummy pattern generation and the connection through the via hole are executed immediately after the layout designing and prior to the calculations on the capacitance and resistance; therefore, it becomes possible to avoid inconsistency occurring between the results of calculations and actual tests in a semiconductor.

(Third Embodiment)

A memory medium in accordance with the third embodiment of the present invention is a memory medium in which a program described in the second embodiment is stored.

The application of this allows a computer to read and execute the program so that the load imposed on the operator can be reduced, and the above-mentioned designing method can be carried out accurately at high speeds.

(Fourth Embodiment)

Figure 16A:
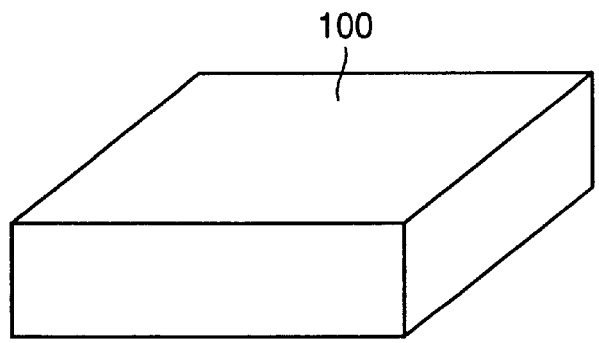
FIGS. 16A and 16B are conceptual drawings that show a semiconductor device in a fourth embodiment in accordance with the present invention.
Figure 16B:
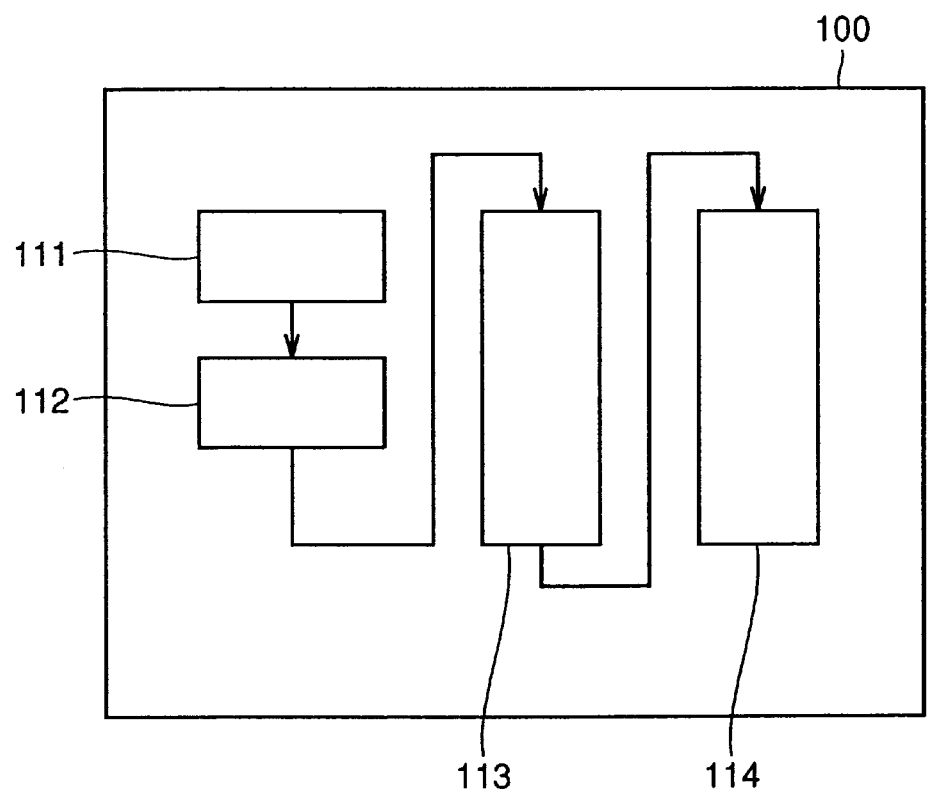
Figure 17:
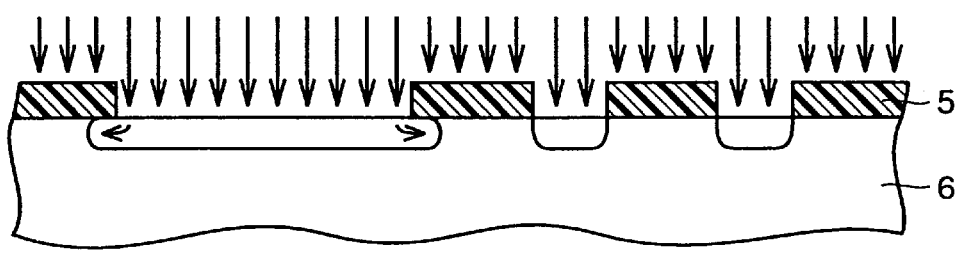
FIG. 17 is an explanatory drawing that shows a manufacturing process of a semiconductor device in accordance with a prior art.

FIGS. 16A and 16B show a construction of a designing device in accordance with the fourth embodiment of the present invention. FIG. 16A is a conceptual drawing that shows a designing device 100, which may be an independent device from a designing CAD, or this one system may also be used as a designing CAD. This also may have a system which has a built-in computer that reads the program and carries out the designing method as described in the second embodiment.

FIG. 16B is a conceptual drawing that shows the inside of this designing device 100. This designing device 100 is provided with a dummy pattern generation means 111, an unconnected dummy pattern setting means 112, a first recursive process executing means 113 and a second recursive process executing means 114. It is preferable to realize these means on the computer system.

The dummy pattern generation means 111 generates layout data for the dummy pattern as explained in the second embodiment. The unconnected dummy pattern setting means 112 puts flags on all the dummy patterns generated by the dummy pattern generation means 111 as unconnected dummy pattern. With respect to the first recursive process executing means 113 and the second recursive process executing means 114, one of them is used when the power-supply wire serves as the reference wire, and the other is used when the ground wire serves as the reference wire. Here, although either of them may be driven first, they execute the second process as described in the second embodiment recursively based upon the respectively determined reference wire, etc.

The results finally obtained are outputted as the stream.

By using the designing device as described above, it is possible to carry out a designing process in which the dummy pattern layout and electrical connections from the dummy patterns to the power-supply wire or the ground wire are efficiently placed.

In accordance with the present invention, dummy patterns are placed so that it becomes possible to eliminate the difference in density in a mask in the photolithographic technique, and consequently to improve the patterning precision. Moreover, the dummy patterns are fixed to either the power-supply wire or the ground wire so that each of the dummy patterns is allowed to serve as a shield, thereby making it possible to prevent cross-talk noise from occurring between the signal wires.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a plurality of wiring layers vertically overlapping with each other, including a first layer and a second layer; a power-supply wire; and a ground wire;

wherein said first layer and said second layer include a dummy pattern, each arranged to alleviate for a difference in density in a planar layout of wiring pattern in a same layer, said dummy pattern of said first layer and said dummy pattern of said second layer are electrically connected with each other and further electrically connected to a reference wire which is either said power-supply wire or said ground wire.

2. The semiconductor device according to claim 1, wherein electrical connection between said dummy pattern and said reference wire is made through paths formed by a process including a first step of:

setting all said dummy patterns as unconnected dummy patterns, and a second step of:

retrieving any said unconnected dummy patterns that overlap each other and are adjacent to each other in an up and down direction with not less than a predetermined distance using a target wire which is either said reference wire or wires having the same electrical potential as said reference wire as the starting point, in the case when, as a result of said retrieval, any of such said unconnected dummy patterns are detected, recognizing these as adjacent dummy patterns and providing an interlayer connection between said target wire and said adjacent dummy patterns, as well as changing the setting of said adjacent dummy patterns as non-unconnected dummy patterns with said adjacent dummy patterns being set as those having the same electric potential as said target wire, recursively repeating said second step with respect to all said reference wires and those wires having the same electrical potential as said reference wire, in place of said reference wire, with the other of said power-supply wire and said ground wire being newly used as a reference wire, recursively repeating said second step with respect to all said reference wires and those wires having the same electrical potential as said reference wire.

3. A designing device of a semiconductor device comprising:

a dummy pattern generation means for generating dummy patterns so as to eliminate a difference in density in a wiring pattern based upon wiring layout information that has been provided;

an unconnected dummy pattern setting means for setting all said dummy patterns as unconnected dummy patterns so as to electrically connect said dummy patterns and said reference wire with one of a power-supply wire and a ground wire being used as a reference wire based upon layout information of a power-supply wire and a ground wire that has been supplied;

a first recursive process executing means which retrieves any said unconnected dummy patterns that overlap each other and are adjacent to each other in an up and down direction with not less than a predetermined distance using a target wire which is either said reference wire or wires having the same electrical potential as said reference wire as the starting point for a dummy pattern connection process, which in said case when, as a result of said retrieval, any of such unconnected dummy patterns are detected, recognizes these as adjacent dummy patterns and provides an interlayer connection between said target wire and said adjacent dummy patterns, as well as changing the setting of said adjacent dummy patterns as non-unconnected dummy patterns with said adjacent dummy patterns being set as those having said same electric potential as said target wire, which recursively repeats said sequence of jobs with respect to all said reference wire and those wires having the same electrical potential as said reference wire, and a second recursive process job executing means which, in place of said reference wire, with the other of said power-supply wire and said ground wire being newly used as said reference wire, recursively repeats said dummy pattern connection process with respect to all said reference wires and those wires having said same electrical potential as said reference wire.

* * * * *